United States Patent
Tai et al.

(10) Patent No.: US 8,373,253 B2
(45) Date of Patent: Feb. 12, 2013

(54) SEMICONDUCTOR STRUCTURE

(75) Inventors: Han-Chung Tai, Kaohsiung (TW); Hsin-Chih Chiang, Hsinchu (TW)

(73) Assignee: System General Corp., Taipei (TW)

( * ) Notice: Subject to any disclaimer, the term of this patent is extended or adjusted under 35 U.S.C. 154(b) by 228 days.

(21) Appl. No.: 12/875,455

(22) Filed: Sep. 3, 2010

(65) Prior Publication Data

US 2011/0260291 A1    Oct. 27, 2011

(30) Foreign Application Priority Data

Apr. 23, 2010    (CN) .......................... 2010 1 0169798

(51) Int. Cl.
    *H01L 29/861*    (2006.01)
(52) U.S. Cl. ................ 257/546; 257/E29.327
(58) Field of Classification Search .................. 257/546, 257/E29.327
    See application file for complete search history.

(56) References Cited

U.S. PATENT DOCUMENTS

| | | | |
|---|---|---|---|
| 4,875,130 A | 10/1989 | Huard | |
| 2006/0157744 A1* | 7/2006 | Chou et al. | 257/244 |
| 2009/0179247 A1* | 7/2009 | Fujii et al. | 257/300 |
| 2009/0278204 A1* | 11/2009 | Morino et al. | 257/356 |
| 2011/0024847 A1* | 2/2011 | Morino et al. | 257/371 |

OTHER PUBLICATIONS

Chinese language office action dated Aug. 10, 2011.

* cited by examiner

*Primary Examiner* — Teresa M Arroyo
*Assistant Examiner* — Whitney T Moore
(74) *Attorney, Agent, or Firm* — McClure, Qualey & Rodack, LLP

(57) ABSTRACT

A semiconductor structure. The semiconductor comprises a substrate, a first deep well, a diode and a transistor. The first deep well is formed in the substrate. The diode is formed in the first deep well. The transistor is formed in the first deep well. The diode is connected to a first voltage, the transistor is connected to a second voltage, and the diode and the transistor are cascaded.

8 Claims, 5 Drawing Sheets

SEMICONDUCTOR STRUCTURE

This application claims the benefit of People's Republic of China application Serial No. 201010169798.4, filed Apr. 23, 2010, the subject matter of which is incorporated herein by reference.

BACKGROUND OF THE INVENTION

1. Field of the Invention

The invention relates in general to a semiconductor structure, and more particularly to a semiconductor structure with electrostatic discharge protection.

2. Description of the Related Art

In general, integrated circuits (ICs) are susceptible to the electrostatic discharge (ESD) and damaged by the ESD such as the high-voltage transient of an electronic device. In some electronic devices, the high-voltage transient could be have positive and/or negative peaks, and the high-voltage transient may range from hundreds to thousands of volts (V) of static voltage, and the duration may last for several micro-seconds. The high-voltage electrostatic discharge transient could be caused by the user's electrostatic discharge, for example, when the user contacts the terminals or circuits of the integrated circuits (such as apparatus control) or the casing of an apparatus through friction or sensing. Thus, the static voltage caused by negligence may damage the input transistor.

The integrated circuits normally need electrostatic discharge protection circuit to protect the electronic components of an electronic device. However, conventional electrostatic discharge protection structure, such as a high-voltage diode, the voltage is too high and the conducting impedance is too large. Thus, when the voltage increases, the increase in the current is very tiny, and the expected levels of the operating voltage and the current of the high-voltage diode cannot be reached.

FIG. 1 shows a semiconductor structure of generally known technology. The semiconductor structure 5 comprises a substrate 50, an N-type deep well 55, a P-type deep well 60, an N-type deep well 65, an N-type doping well 70, a P-type doping well 75, an insulating material 80, a high-voltage 90 and a low-voltage 95. In terms of location relationship, the N-type deep well 55 is formed in the substrate 50, the P-type deep well 60 is formed in the N-type deep well 55, the N-type deep well 65 is formed in the P-type deep well 60, the P-type doping well 75 is formed in the P-type deep well 60, and the N-type doping well 70 is formed in the N-type deep well 65, wherein, the high-voltage 90 is connected to the N-type doping well 70, and the low-voltage 95 is connected to the P-type doping well 75.

Given that the area is 95 um×150 um, the experimental results obtained according to the generally known technology are illustrated in FIG. 2. FIG. 2 shows a current-voltage relationship diagram of a semiconductor structure of generally known technology. As indicated in FIG. 2, the breakdown voltage is 30V, and the slope of current vs. voltage is very small, and 10V increase in the voltage only leads to 0.3 A increase in the current. The small slope is ascribed to the parasitic resistance of the structure of generally known technology being too larger. Moreover, the human body model of structure of generally known technology is 0.5 KV, which is far below the standard (at least 2 KV) of the integrated circuits.

SUMMARY OF THE INVENTION

The invention is directed to a semiconductor structure. Through the combination of a diode and a transistor, so that the slope of current vs. voltage is increased, and the start voltage (breakdown voltage) is maintained at 30V.

According to a first aspect of the present invention, a semiconductor structure is disclosed. The semiconductor structure comprises a substrate, a first deep well, a diode and a transistor. The first deep well is formed in the substrate, the diode is formed in the first deep well, and the transistor is formed in the first deep well, wherein the diode is connected to the first voltage, the transistor is connected to the second voltage, and the diode and the transistor are cascaded.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
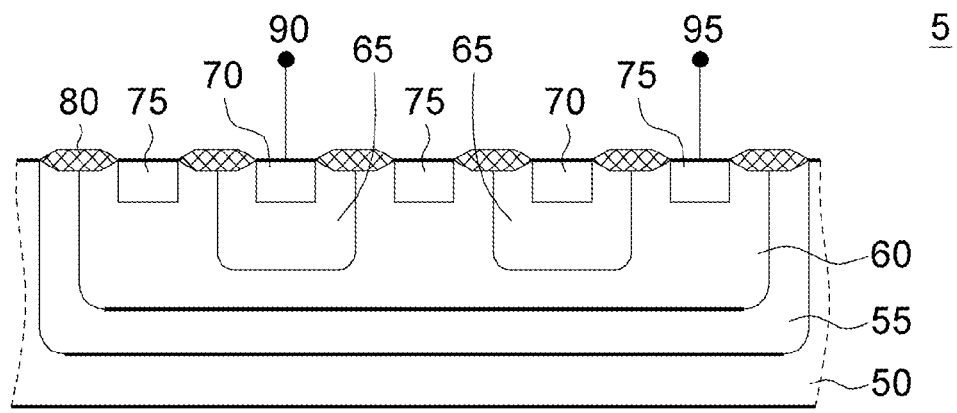
FIG. 1 (Prior art) shows a semiconductor structure of generally known technology.
Figure 2:
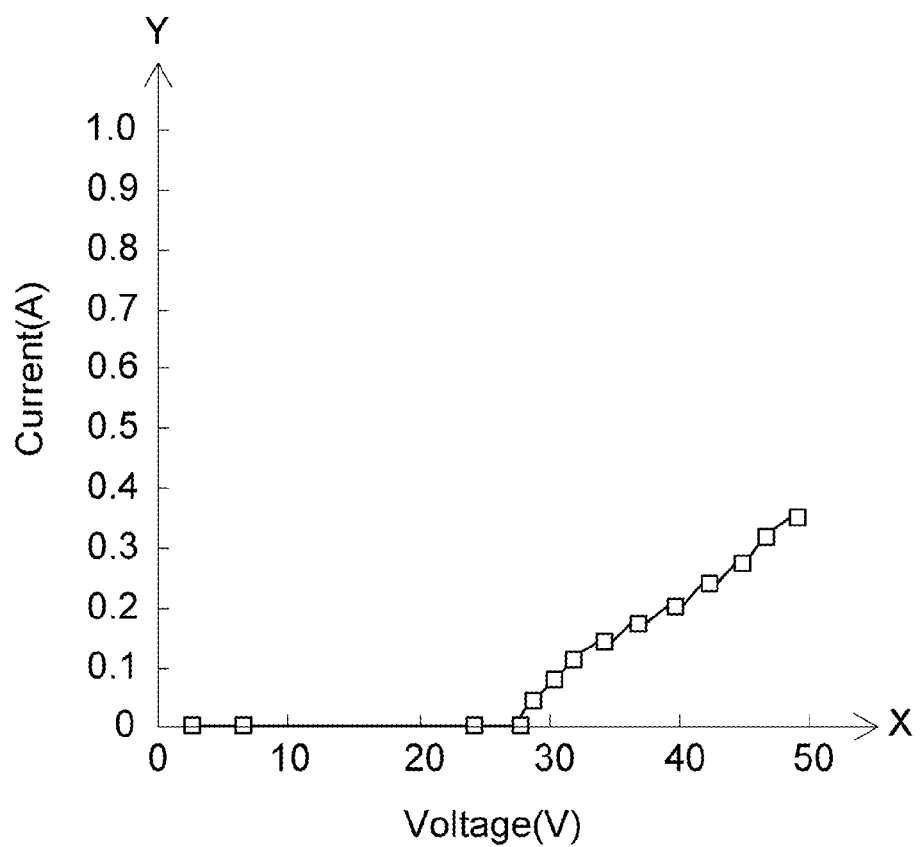
FIG. 2 (Prior art) shows a current-voltage relationship diagram of a semiconductor structure of generally known technology.

Two embodiments are disclosed below for elaborating the semiconductor structure of the invention. However, the embodiments below are for detailed description of the invention not for limiting the scope of protection of the invention. Anyone who is skilled in the technology of the invention will understand that the structure of the diode and the transistor illustrated in the drawings can be modified under the spirit of the invention. Thus, the drawings are for elaborating not for limiting the scope of the invention. Moreover, only primary elements are illustrated in the drawings, and secondary elements are omitted to highlight the technical features of the invention.

First Embodiment

Figure 3:
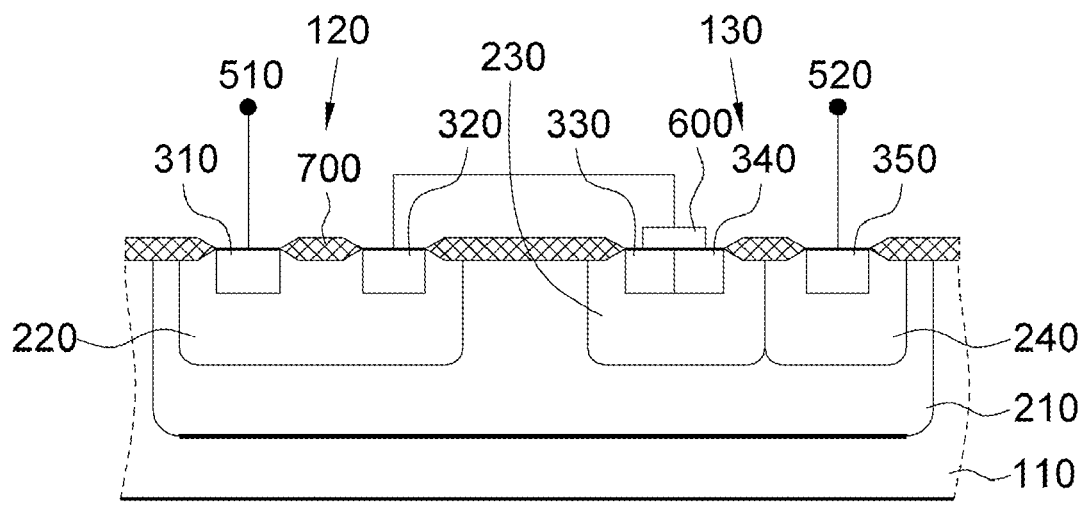
FIG. 3 shows a semiconductor structure according to a first embodiment.

Referring to FIG. 3, a semiconductor structure 10 according to a first embodiment is shown. The semiconductor structure 10 comprises a substrate 110, a first deep well 210, a diode 120 and a transistor 130. The doping type of the substrate 110 is P-type, and the doping mode of the first deep well 210 is N-type. The first deep well 210 is formed in the substrate 110. The diode 120 is formed in the first deep well 210. The transistor 130 is formed in the first deep well 210. The diode 120 is connected to the first voltage 510, the transistor 130 is connected to the second voltage 520, and the diode 120 and the transistor 130 are cascaded.

The diode 120 comprises a second deep well 220, a first doping well 310 and a second doping well 320. The doping of the second deep well 220 and the first doping well 310 both are P-type, and the doping mode of the second doping well 320 is N-type. In terms of location relationship, the second deep well 220 is formed in the first deep well 210, the first doping well 310 is formed in the second deep well 220 and connected to the first voltage 510, and the second doping well 320 is formed in the second deep well 220 and coupled to the transistor 130.

Besides, the transistor 130 comprises a third deep well 230, a fourth deep well 240, a third doping well 330, a fourth doping well 340 and a fifth doping well 350. The doping mode of the third deep well 230 and the third doping well 330 both are P-type, and the doping mode of the fourth deep well 240, the fourth doping well 340 and the fifth doping well 350 all are N-type. In terms of location relationship, the third deep well 230 is formed in the first deep well 210, the fourth deep well 240 is also formed in the first deep well 210, and the third doping well 330 and the fourth doping well 340 both are formed in the third deep well 230. The third doping well 330 and the fourth doping well 340, which are adjacent to each other, are electrically connected through a conductive element (conductive wire) 600 and then are connected to the diode 120. The fifth doping well 350 is formed in the fourth deep well 240 and connected to the second voltage 520.

The insulating material 700 of FIG. 3 is disposed between the first doping well 310 and the second doping well 320, between the second doping well 320 and the third doping well 330, and between the fourth doping well 340 and the fifth doping well 350.

Figure 4:
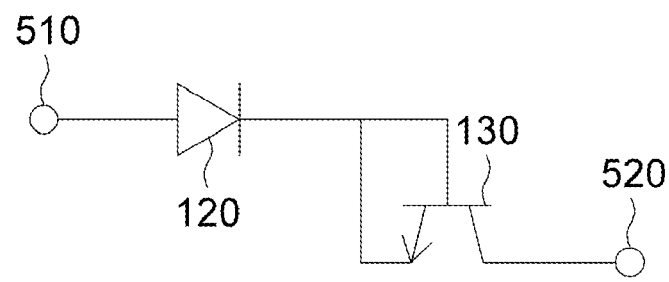
FIG. 4 shows a circuit diagram of a semiconductor structure according to a first embodiment.

Referring to FIG. 4, a circuit diagram of a semiconductor structure 10 according to a first embodiment is shown. The components of FIG. 4 are serially connected in the following manner: the first voltage 510 cascades the diode 120, the diode 120 cascades the transistor 130, and then the transistor 130 cascades the second voltage 520.

Figure 5:
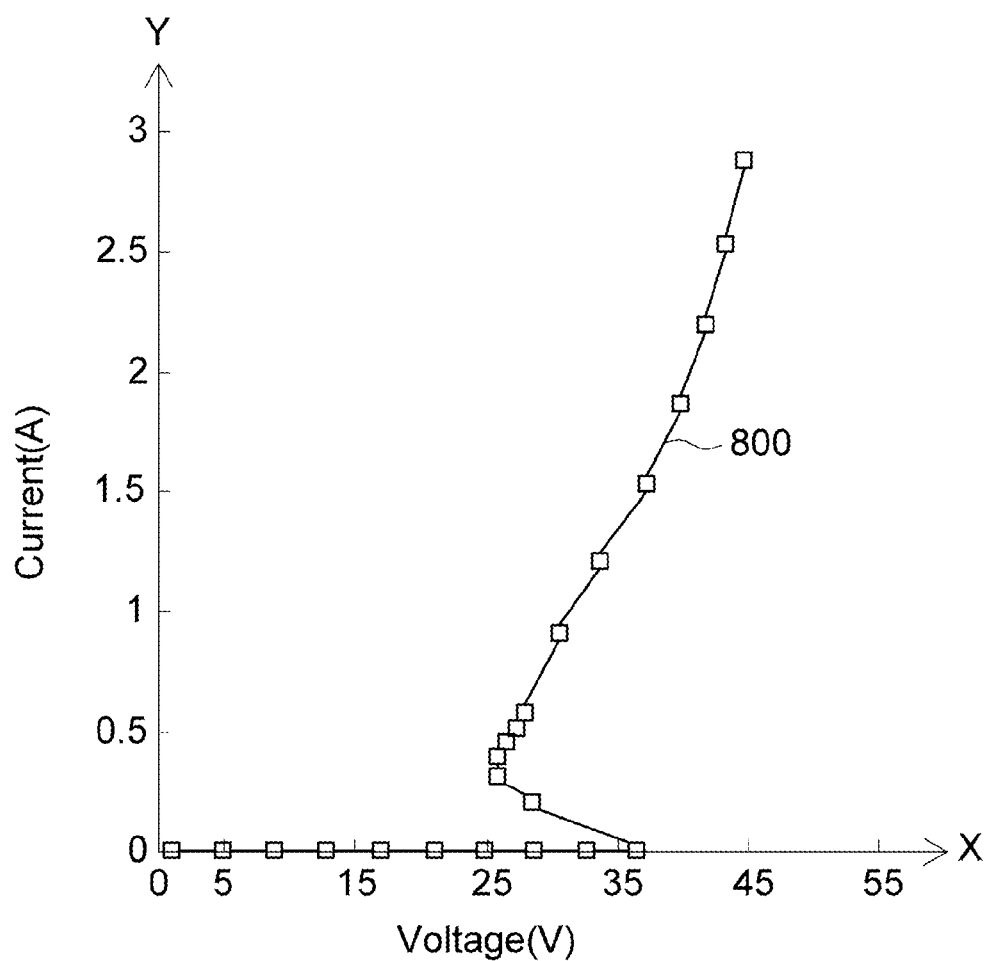
FIG. 5 shows a current-voltage relationship diagram of a semiconductor structure according to a first embodiment.

Referring to FIG. 5, a current-voltage relationship diagram of a semiconductor structure 10 according to a first embodiment is shown. In the present embodiment of the invention, given that the area is 95 um×150 um, let the first voltage 510 be set at low-voltage and the second voltage 520 be set at high-voltage, the experimental results are illustrated in FIG. 5. As indicated in FIG. 5, the breakdown voltage is 36V, the operating voltage is 27V, and the slope of current vs. voltage is larger than that according to the generally known technology. For example, given that the voltage is 40V, the corresponding current volume is 2 A according to the present embodiment of the invention; given that the voltage is 40V, the corresponding current volume is only 0.3 A according to the generally known technology.

In greater details, the current-voltage relationship curve 800 of FIG. 5 intersects the X-axis at 36V, which is a breakdown voltage of the semiconductor structure 10. The breakdown voltage of the semiconductor structure 10 is the sum of the breakdown voltage of the diode 120 and the breakdown voltage of the transistor 130. The breakdown voltage of the diode 120 is 15V, the breakdown voltage of the transistor 130 is 21V, and the sum of 15V and 21V is 36V. After the transistor 130 reaches the breakdown voltage, the voltage of the transistor 130 immediately drops to 10V, but the voltage of the diode 120 still remains at 15V, and the sum of 10V and 15V is the operating voltage 25V, which is the minimum voltage of the relationship curve 800. After the relationship curve 800 reaches the operating voltage, the slope of current vs. voltage is significantly larger than that according to the generally known technology. According to the present embodiment of the invention, given that no significant variation occurs to the breakdown voltage, the impedance is significantly reduced and the current volume is largely improved. In addition, the human body model (HBM) of the present embodiment of the invention is larger than 2 KV, which is far better than the human body model of the generally known technology which is merely 0.5 KV.

In the above embodiment, the first voltage 510 is set at low-voltage, and the second voltage 520 is set at high-voltage. However, in another embodiment, the first voltage 510 can be set at high-voltage and the second voltage 520 can be set at low-voltage to meet the needs of the design.

Second Embodiment

Figure 6:
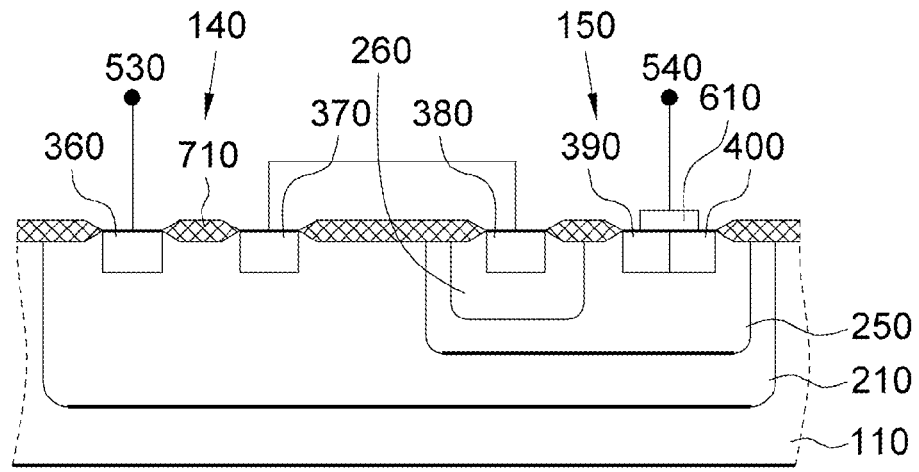
FIG. 6 shows a semiconductor structure according to a second embodiment.

Referring to FIG. 6, a semiconductor structure 20 according to a second embodiment is shown. The semiconductor structure 20 of the present embodiment of the invention is different from the semiconductor structure 10 of the first embodiment only in the locations of the deep wells and the doping wells, and the similarities are not repeated here.

In the present embodiment of the invention, the diode 140 comprises a sixth doping well 360 and a seventh doping well 370. The sixth doping well 360 is an N-type doping mode, and the seventh doping well 370 is a P-type doping mode. In terms of location relationship, the sixth doping well 360 is formed in the first deep well 210 and connected to the first voltage 530, and the seventh doping well 370 is formed in the first deep well 210 and coupled to the transistor 150.

The transistor 150 comprises a fifth deep well 250, a sixth deep well 260, an eighth doping well 380, a ninth doping well 390 and a tenth doping well 400. The doping mode of the fifth deep well 250 and the tenth doping well 400 both are P-type, and the doping mode of the sixth deep well 260, the eighth doping well 380 and the ninth doping well 390 all are N-type. In terms of location relationship, the fifth deep well 250 is formed in the first deep well 210, and the sixth deep well 260 is formed in the fifth deep well 250, the eighth doping well 380 is formed in the sixth deep well 260 and connected to the diode 140, the ninth doping well 390 is formed in the fifth deep well 250, and the tenth doping well 400 is formed in the fifth deep well 250. The ninth doping well 390 and the tenth doping well 400, which are adjacent to each other, are electrically connected through a conductive component 610 and then are further connected to the second voltage 540.

The insulating material 710 is disposed between the sixth doping well 360 and the seventh doping well 370, between the seventh doping well 370 and the eighth doping well 380, and between the eighth doping well 380 and the ninth doping well 390.

Figure 7:
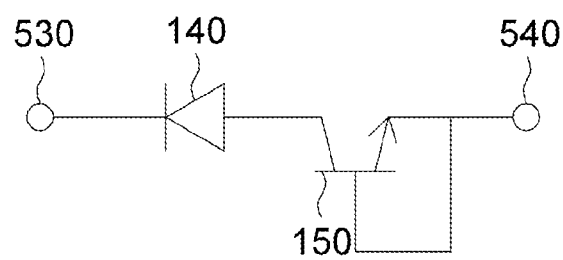
FIG. 7 shows a circuit diagram of a semiconductor structure according to a second embodiment.

Referring to FIG. 7, a circuit diagram of a semiconductor structure 20 according to a second embodiment is shown. The components of FIG. 7 are serially connected in the following manner: the first voltage 530 cascades the diode 140, the diode 140 cascades the transistor 150, and then the transistor 150 cascades the second voltage 540.

Figure 8:
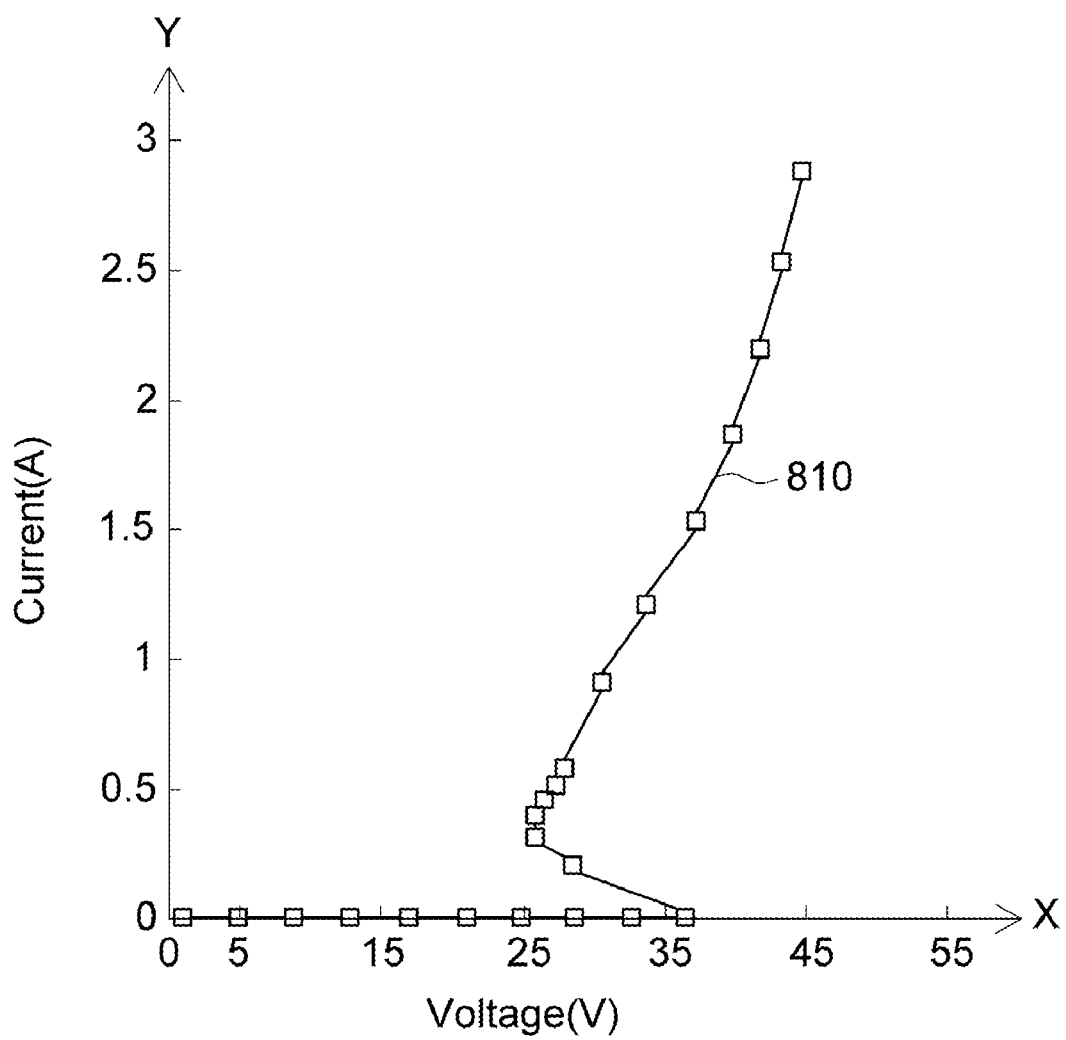
FIG. 8 shows a current-voltage relationship diagram of a semiconductor structure according to a second embodiment.

Referring to FIG. 8, a current-voltage relationship diagram of a semiconductor structure 20 according to a second embodiment is shown. In the present embodiment of the invention, given that the area is 95 um×150 um, let the first voltage 530 be set at high-voltage and the second voltage 540 be set at low-voltage, the experimental results are illustrated in FIG. 8. As indicated in FIG. 8, the breakdown voltage of the semiconductor structure 20 is 36V, the operating voltage is 27V, and the slope of current vs. voltage is larger than that according to the generally known technology. For example, given that the voltage is 40V, the corresponding current volume is 2 A according to the present embodiment of the invention; given that the voltage is 40V, the corresponding current volume is only 0.3 A according to the generally known technology.

In greater details, the current-voltage relationship curve 810 of FIG. 8 intersects the X-axis at 36V, which is a breakdown voltage of the semiconductor structure 20. The breakdown voltage of the semiconductor structure 20 is the sum of the breakdown voltage of the diode 140 and the breakdown voltage of the transistor 150. The breakdown voltage of the diode 140 is 15V, the breakdown voltage of the transistor 150 is 21V, and the sum of 15V and 21V is 36V. After the transistor 150 reaches the breakdown voltage, the voltage of the transistor 1530 immediately drops to 10V, but the voltage of the diode 140 still remains at 15V, and the sum of 10V and 15V is the operating voltage 25V, which is the minimum voltage of the relationship curve 810. After the relationship curve 810 reaches the operating voltage, the slope of current vs. voltage is significantly larger than that according to the generally known technology. According to the present embodiment of the invention, given that no significant variation occurs to the breakdown voltage, the impedance is significantly reduced and the current volume is largely improved. In addition, the human body model (HBM) of the present embodiment of the invention is larger than 2 KV, which is far better than the human body model of the generally known technology which is merely 0.5 KV.

In the above embodiment, the first voltage 530 is set at low-voltage, and the second voltage 540 is set at high-voltage. However, in another embodiment, the first voltage 530 can be set at high-voltage and the second voltage 540 can be set at low-voltage to meet the needs of the design.

According to the embodiments of the invention, the diode and the transistor are cascaded, and fewer deep wells are implanted in the diode than in the high-voltage diode according to the generally known technology. Thus, the problem of the impedance of the high-voltage diode being too high, which occurs to the generally known technology, is resolved. However, the breakdown voltage drops accordingly. In order to boost the decreased breakdown voltage, the transistor and the diode are cascaded for boosting the breakdown voltage. Despite the design of serial connection decreases the impedance, the current amplified by the transistor suffices to increase the slope of the current-voltage relationship curve of the semiconductor structure to meet the expectation.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures. Moreover, anyone who is skilled in the technology of the invention would also understand the basics of the technology of the invention such as the formation of the P-type doping mode and the N-type doping mode, and the basics are not repeated here.

What is claimed is:

1. A semiconductor structure, comprising:
   a substrate;
   a first deep well formed in the substrate;
   a diode formed in the first deep well; and
   a transistor formed in the first deep well;
   wherein, the diode is connected to a first voltage, the transistor is connected to a second voltage, and the diode and the transistor are cascaded,
   wherein the transistor comprises:
      a fifth deep well formed in the first deep well;
      a sixth deep well formed in the fifth deep well;
      a eighth doping well formed in the sixth deep well and connected to the diode;
      a ninth doping well formed in the fifth deep well; and
      a tenth doping well formed in the fifth deep well, wherein the ninth doping well and the tenth doping well are adjacent to each other and connected to the second voltage.

2. The semiconductor structure according to claim 1, wherein the diode comprises:
   a sixth doping well formed in the first deep well and connected to the first voltage; and
   a seventh doping well formed in the first deep well and connected to the transistor.

3. The semiconductor structure according to claim 2, wherein the substrate and the seventh doping well have a first doping mode, the first deep well and the sixth doping well have a second doping mode, and the first doping mode and the second doping mode are complementary to each other.

4. The semiconductor structure according to claim 3, wherein the first doping mode is P-type, the second doping mode is N-type.

5. The semiconductor structure according to claim 1, wherein the substrate, the fifth deep well, and the tenth doping well have a first doping mode, the sixth deep well, the eighth doping well and the ninth doping well have a second doping mode, and the first doping mode and the second doping mode are complementary to each other.

6. The semiconductor structure according to claim 5, wherein the first doping mode is P-type, and the second doping mode is N-type.

7. The semiconductor structure according to claim 1, wherein the first voltage is higher than the second voltage.

8. The semiconductor structure according to claim 1, wherein the second voltage is higher than the first voltage.

* * * * *